United States Patent
Chih et al.

(10) Patent No.: US 10,332,765 B1
(45) Date of Patent: Jun. 25, 2019

(54) WAFER SHIPPING DEVICE

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Chu-Fang Chih, Hsinchu (TW); Chih-Chieh Liao, Hsinchu (TW); Chia-Jen Kao, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/993,614

(22) Filed: May 31, 2018

(30) Foreign Application Priority Data

Mar. 9, 2018 (CN) .......................... 2018 1 0193100

(51) Int. Cl.
- *H01L 21/67* (2006.01)
- *H01L 21/673* (2006.01)
- *G08B 5/36* (2006.01)
- *G08B 21/18* (2006.01)

(52) U.S. Cl.
CPC .......... *H01L 21/67294* (2013.01); *G08B 5/36* (2013.01); *G08B 21/18* (2013.01); *H01L 21/67376* (2013.01); *H01L 21/67383* (2013.01)

(58) Field of Classification Search
CPC ......... H01L 21/67294; H01L 21/67376; H01L 21/67383; G08B 21/18; G08B 5/36
USPC ......................................................... 340/687
See application file for complete search history.

(56) References Cited

U.S. PATENT DOCUMENTS

| | | | | |
|---|---|---|---|---|
| 6,431,814 B1 * | 8/2002 | Christensen | ...... | H01L 21/67271 702/81 |
| 2003/0070960 A1 * | 4/2003 | Chen | ................ | H01L 21/67265 206/711 |
| 2013/0325179 A1 * | 12/2013 | Liao | ...................... | B25J 9/1692 700/254 |
| 2016/0035607 A1 * | 2/2016 | Lee | ................... | H01L 21/67294 414/304 |
| 2016/0129586 A1 * | 5/2016 | Moura | ............. | H01L 21/67265 700/228 |
| 2017/0294329 A1 * | 10/2017 | Gregerson | ........ | H01L 21/67389 |
| 2017/0365496 A1 * | 12/2017 | Mushel | ............ | H01L 21/67369 |
| 2018/0102269 A1 * | 4/2018 | Liu | ................... | H01L 21/67359 |
| 2018/0182655 A1 * | 6/2018 | Yokoyama | ........ | H01L 21/67373 |

* cited by examiner

*Primary Examiner* — Hirdepal Singh
(74) *Attorney, Agent, or Firm* — CKC & Partners Co., LLC

(57) ABSTRACT

A wafer shipping device includes a box body having a first slot, a cover body having a second slot, and a sensing circuit module having a first sensor, a second sensor, an indication circuit and a warning device. The first slot and the second slot are used to collaboratively hold a semiconductor wafer. The first sensor and the first sensor are located in the box body for independently sensing whether the semiconductor wafer is inserted in the first slot and the second slot respectively. The indication circuit is electrically connected to the first sensor, the second sensor and the warning device, and correspondingly issued one of types of indication signals to the warning device in response to sensing results obtained from the first sensor and the second sensor respectively.

9 Claims, 9 Drawing Sheets

WAFER SHIPPING DEVICE

RELATED APPLICATIONS

This application claims priority to China Application Serial Number 201810193100.9, filed Mar. 9, 2018, which is herein incorporated by reference.

BACKGROUND

Field of Disclosure

The present disclosure relates to a wafer shipping device. More particularly, the present disclosure relates to a wafer shipping device that can accurately determine if a wafer has been correctly placed therein.

Description of Related Art

In general, semiconductor wafers are usually loaded in parallel in a cassette carrier during a semiconductor process, so as to facilitate transporting the cassette carrier containing the semiconductor wafers to a next stop. More specifically, first slits and second slits that are aligned with each other are formed on two opposite inner walls of the cassette carrier respectively. When each of the semiconductor wafers is inserted into one of the first slits and one of the second slits which are corresponding to each other, thereby sequentially holding the semiconductor wafers in the cassette carrier. However, if a semiconductor wafer is not inserted into the corresponding first and second slits, the semiconductor wafer may be tilt to be scratched or fragmented when being transported or handled, thus further affecting other neighboring semiconductor wafers in the cassette carrier.

Currently, after the semiconductor wafers have been loaded in the cassette carrier, a worker cannot accurately determine whether each of the semiconductor wafers is placed in the correct first and second slits in the cassette carrier easily. Thus, the probability of wafer fragmentation cannot be effectively reduced, and the location at which the semiconductor wafer is damaged cannot be identified.

SUMMARY

According to one embodiment, a wafer shipping device is provided. The wafer shipping device includes a box body, a cover body, a first side rack, a second side rack and at least one sensing circuit module. The box body includes at least one first inserting slot. The first side rack is disposed in the box body, and includes at least one first slit. The second side rack is disposed in the box body and is opposite to the first side rack. The second side rack includes at least one second slit corresponding to the first slit. The cover body detachably covers the box body, and includes at least one second inserting slot that is horizontally aligned with the first inserting slot. The second inserting slot faces the first inserting slot correspondingly. The first slit, the second slit, the first inserting slot and the second inserting slot are horizontally arranged for collaboratively holding a semiconductor wafer. The sensing circuit module includes a warning device, a first sensor, a second sensor and an indication circuit. The first sensor is disposed in the box body for independently sensing whether the semiconductor wafer is inserted in the first inserting slot. The second sensor is horizontally aligned with the first sensor for independently sensing whether the semiconductor wafer is in the second inserting slot. The indication circuit is electrically connected to the first sensor, the second sensor and the warning device for correspondingly issuing one of the types of indication signals to the warning device in response to sensing results obtained from the first sensor and the second sensor respectively.

Thus, with the aforementioned embodiments, a worker can accurately determine whether each of the semiconductor wafers is placed in the correct position in the wafer shipping device through the reminder of the warning device. Therefore, the probability of wafer fragmentation can be effectively reduced, and the location at which the semiconductor wafer is damaged can be identified.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure. In the drawings.

DESCRIPTION OF THE EMBODIMENTS

Figure 1:
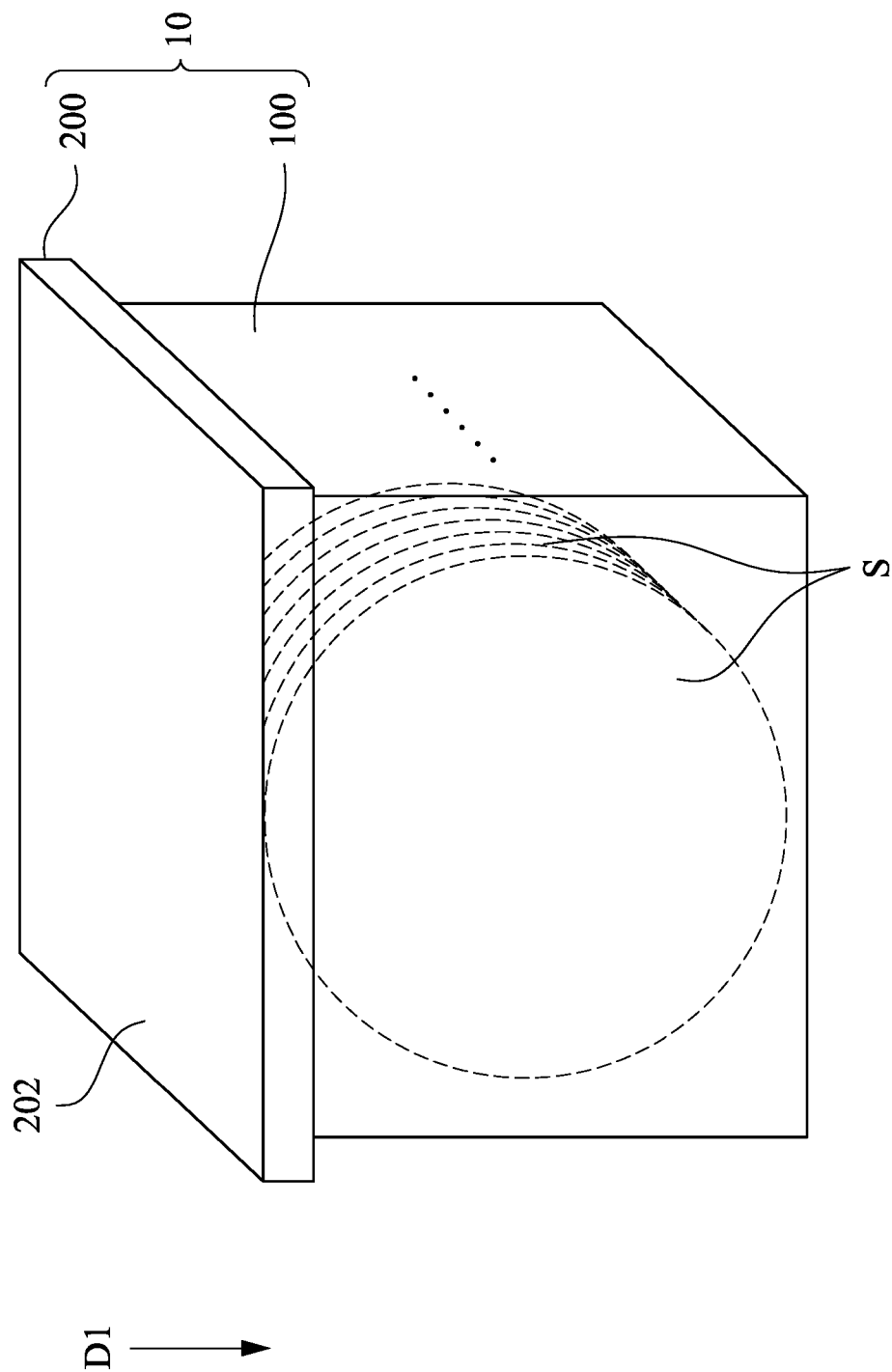
FIG. 1 is a schematic view of a wafer shipping device according to one embodiment of the present disclosure.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the present disclosure.

Figure 2:
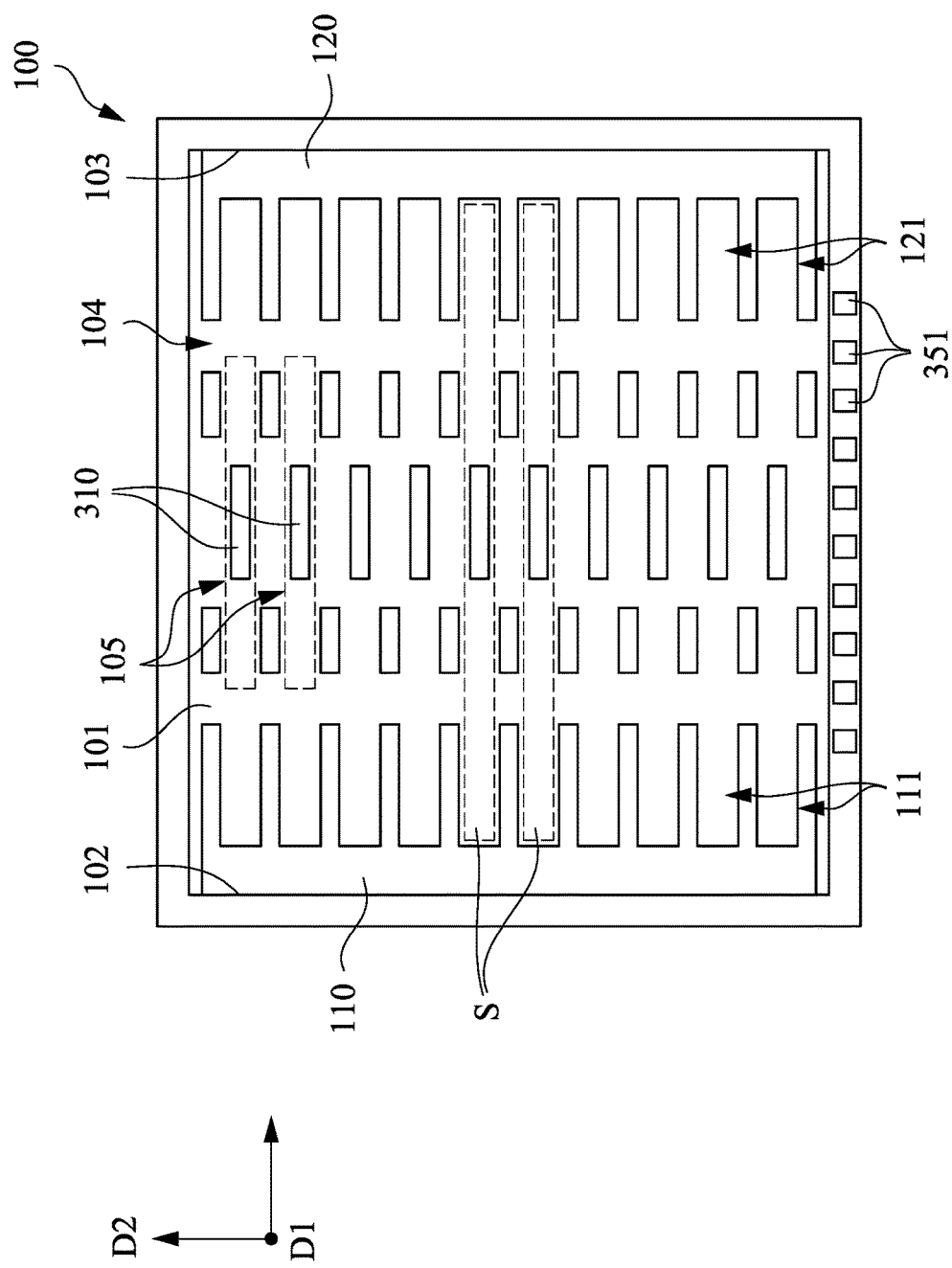
FIG. 2 is a top view of a box body of the wafer shipping device shown in FIG. 1.
Figure 3:
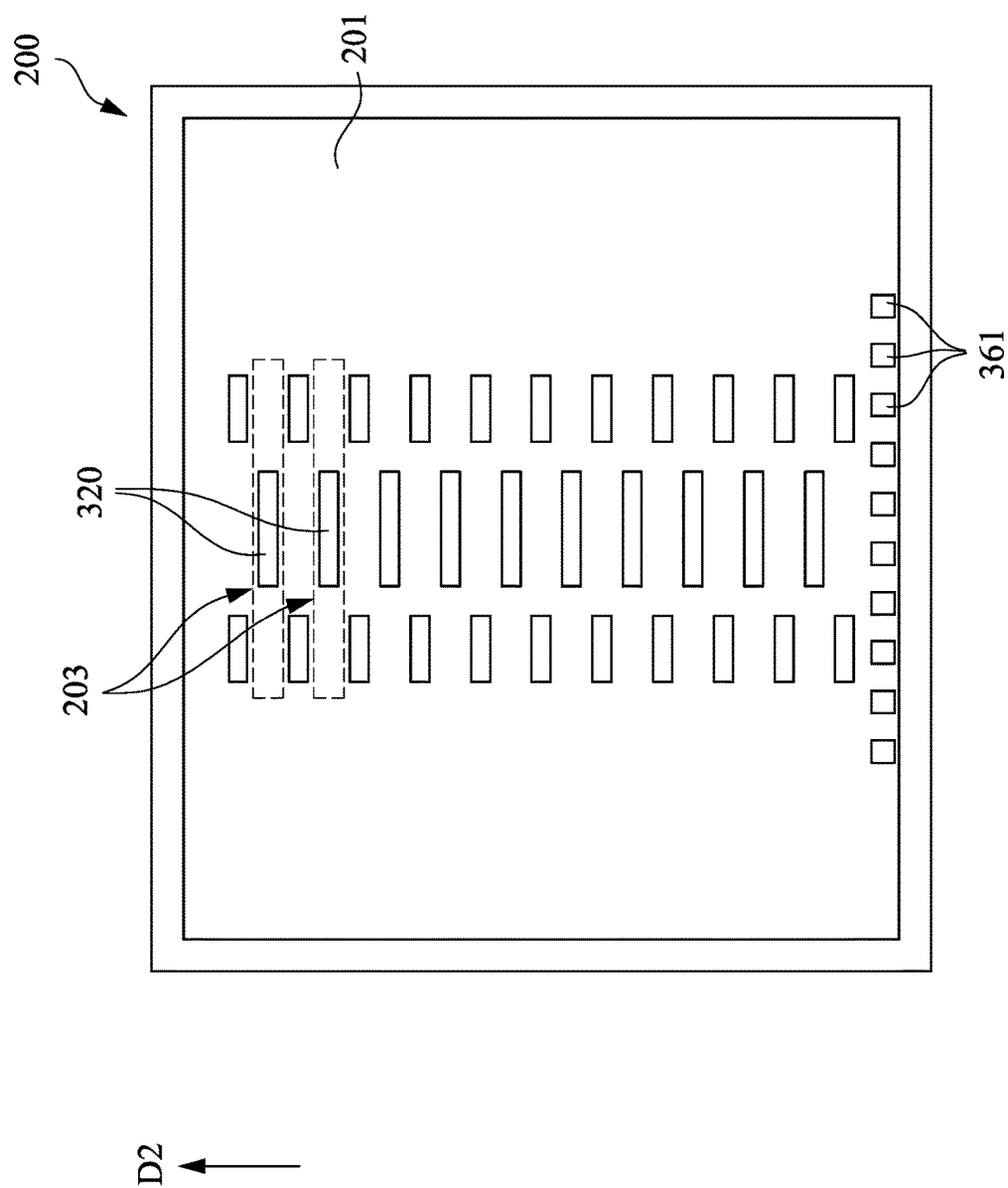
FIG. 3 is a bottom view of a cover body of the wafer shipping device shown in FIG. 1.

Reference is now made to FIG. 1 to FIG. 3 in which FIG. 1 is a schematic view of a wafer shipping device 10 according to one embodiment of the present disclosure, FIG. 2 is a top view of a box body 100 of the wafer shipping device 10 of FIG. 1, and FIG. 3 is a bottom view of a cover body 200 of the wafer shipping device 10 of FIG. 1. As shown in FIG. 1 to FIG. 3, in the embodiment, the wafer shipping device 10 is used to carry a number of (e.g., at least two) semiconductor wafers S spaced by layers. The wafer shipping device 10 includes a box body 100 and a cover body 200 detachably covering the box body 100. The box body 100 includes an accommodation space 104 and a number of first inserting slots 105. The first inserting slots 105 are disposed within the accommodation space 104. The cover body 200 includes a number of second inserting slots 203. Each of the second inserting slots 203 is horizontally coplanar (e.g., in the same level height) with one of the first inserting slots 105, and the second inserting slot 203 and the first inserting slot 105 are horizontally aligned with and opposite to each other. Two opposite sides of each semiconductor wafer S are received in each pair of the second inserting slot 203 and the first inserting slot 105 which are horizontally aligned with each other. Specifically, when a semiconductor wafer S is moved into the accommodation space 104 along an insertion direction D1 by a user, one side of the semiconductor wafer S is inserted into one of the first inserting slots 105. Then, after the cover body 200 covers the accommodation space 104, the corresponding second inserting slot 203 of the cover body 200 can exactly receive the other side of the semiconductor wafer S, such that the semiconductor wafer S is held and positioned in the wafer shipping device 10 collaboratively by the first inserting slot 105 and the corresponding second inserting slot 203. It is noted that, the present disclosure is not limited to the appearance and the form of the first inserting slot and the second inserting slot shown in figures as long as the same pair of the first inserting slot and the second inserting slot are able to receive two opposite sides of the semiconductor wafer.

Figure 4:
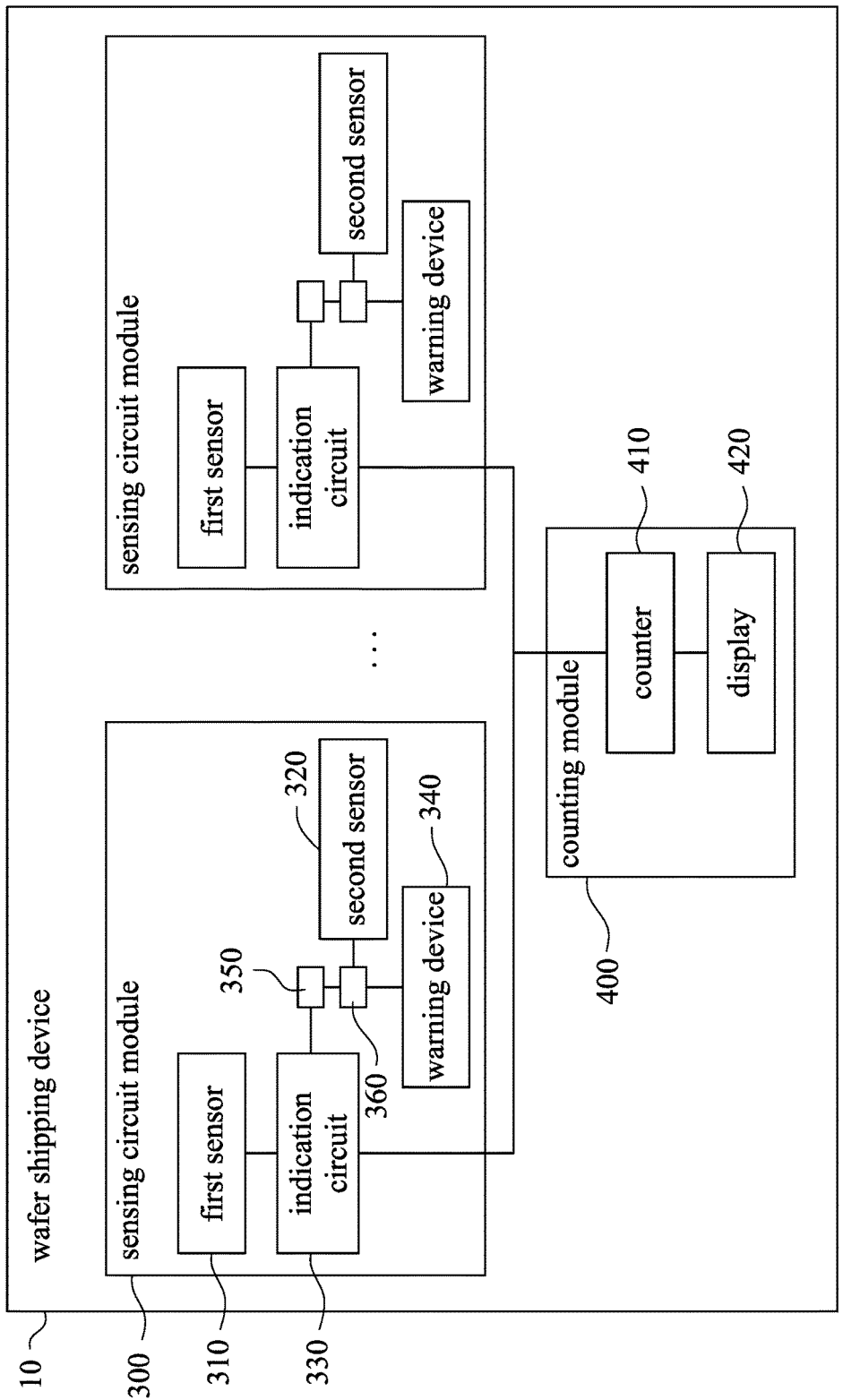
FIG. 4 is an electronic block diagram of the wafer shipping device shown in FIG. 1.

FIG. 4 is an electronic block diagram of the wafer shipping device 10 of FIG. 1. As shown in FIG. 2 to FIG. 4, the wafer shipping device 10 further includes a number of sensing circuit modules 300. Each of the sensing circuit modules 300 includes a first sensor 310, a second sensor 320, an indication circuit 330 and a warning device 340. Each of the first sensors 310 is disposed in one of the first inserting slots 105, and is used to independently sense whether an object (e.g., a semiconductor wafer S) is inserted in the first inserting slot 105. The second sensor 320 is disposed in one of the second inserting slots 203, and horizontally aligned with the first sensor 310, and the second sensor 320 is used to independently sense whether an object (e.g., the semiconductor wafer S) is in the second inserting slot 203. The indication circuit 330 is electrically connected to the first sensor 310, the second sensor 320 and the warning device 340, and is used to correspondingly send out one of types of indication signals to the warning device 340 in response to two sensing results obtained from the first sensor 310 and the second sensor 320, respectively. It is noted that, the first sensor 310 and the second sensor 320 of each of the sensing circuit modules 300 are independently operated sensor components, that is, the first sensor 310 and the second sensor 320 do not have to work together to sense whether an object is in the same level slots. For example, the first sensor 310 and the second sensor 320 of each of the sensing circuit modules 300 are physical button switches, and thus, when one of the first sensor 310 and the second sensor 320 of the sensing circuit module 300 is pressed by the semiconductor wafer S, the sensing result showing that the semiconductor wafer S has been sensed is generated. However, the present disclosure is not limited thereto. In another embodiment, at least one of the first sensor 310 and the second sensor 320 of each of the sensing circuit modules 300 also may be a pressure sensor, an optical transceiver sensor, a magnetoresistance sensor or another conventional type of sensor. Furthermore, the first sensor 310 and the second sensor 320 may be the same or different types of sensors.

Specifically speaking, referring back to FIG. 2, in the embodiment, the first inserting slots 105 are disposed on a bottom surface 101 of the box body 100, and the first inserting slots 105 are arranged in parallel in an arrangement direction D2. The arrangement direction D2 is orthogonal to the above-mentioned insertion direction D1. The second inserting slots 203 are disposed on the inner surface 201 of the cover body 200 facing towards the box body 100, and the second inserting slots 203 are arranged in parallel in the arrangement direction D2. The indication circuit 330 is located on the box body 100, for example, on an outer surface of the box body 100. However, the present disclosure is not limited to the position of the indication circuit 330. The warning device 340 is disposed on the cover body 200. For example, the warning device 340 is disposed on an outer surface 202 of the cover body 200 opposite to the second inserting slots 203. However, the present disclosure is not limited to the position of the warning device 340.

The wafer shipping device 10 further includes a first side rack 110 and a second side rack 120. The first side rack 110 is disposed within the accommodation space 104 of the box body 100, and the first side rack 110 is disposed on one inner wall 102 of the box body 100. The second side rack 120 is disposed within the accommodation space 104 of the box body 100, and the second side rack 120 is disposed on another inner wall 103 of the box body 100. In other words, the second side rack 120 is opposite to the first side rack 110, and the bottom surface 101 of the box body 100 is located between the opposite inner walls 102 and 103 of the box body 100. The first side rack 110 includes a number of first slits 111, and the first slits 111 are arranged in parallel in the arrangement direction D2. The second side rack 120 includes a number of second slits 121, and the second slits 121 are arranged in parallel in the arrangement direction D2. Each of the second slits 121 is horizontally aligned with one of the first slits 111, and the second slit 121 and the first slit 111 which are horizontally coplanar (e.g., in the same level height) with and opposite to each other. One of the first slits 111, one of the second slits 121, one of the first inserting slots 105 and one of the second inserting slots 203 are horizontally arranged with each other for collaboratively holding a semiconductor wafer S. Specifically, when a semiconductor wafer S is moved into the accommodation space 104 along the aforementioned insertion direction D1 by a user, the semiconductor wafer S can be inserted into one of the first slits 111, one of the second slits 121 and one of the first inserting slots 105 which are elevated at the same level. Then, after the cover body 200 covers the accommodation space 104, the corresponding second inserting slot 203 of the cover body 200 can exactly receive the semiconductor wafer S, such that the semiconductor wafer S is held in the wafer shipping device 10. It is noted that, the number of the first inserting slots 105 (or the first slits, the second slits, the second inserting slots) is the same as the maximum capacity of the wafer shipping device 10 for holding the semiconductor wafers S.

Moreover, each of the sensing circuit modules 300 includes a first conductive pattern 350 and a second conductive pattern 360. The first conductive pattern 350 is disposed on the box body 100, and is electrically connected to the indication circuit 330 and the first sensor 310. The second conductive pattern 360 is disposed on the cover body 200, and is electrically connected to the second sensor 320 and the warning device 340. Thus, when the box body 100 has not been covered by the cover body 200 yet, the indication circuit 330 of each of the sensing circuit modules 300 has not been electrically connected to the second sensor 320 and the warning device 340 of the same sensing circuit module 300. Thus, at this moment, the first sensor 310, the second sensor 320, the indication circuit 330 and the warning device 340 does not function. On the contrary, once the box body 100 is covered by the cover body 200 to enable first contacts 351 of the first conductive pattern 350 of the sensing circuit modules 300 to be in physical contact with second contacts 361 of the second conductive pattern 360, the indication circuit 330 of each of the sensing circuit modules 300 is electrically connected to the second sensor 320 and the warning device 340 of the same sensing circuit module 300. Thus, at this moment, the first sensor 310, the second sensor 320, the indication circuit 330 and the warning device 340 can function accordingly. For example, the indication circuit 330 sends out an indication signal to the warning device 340 of the same sensing circuit module 300 in response to the sensing results of the first sensor 310 and the second sensor 320.

Figure 5:
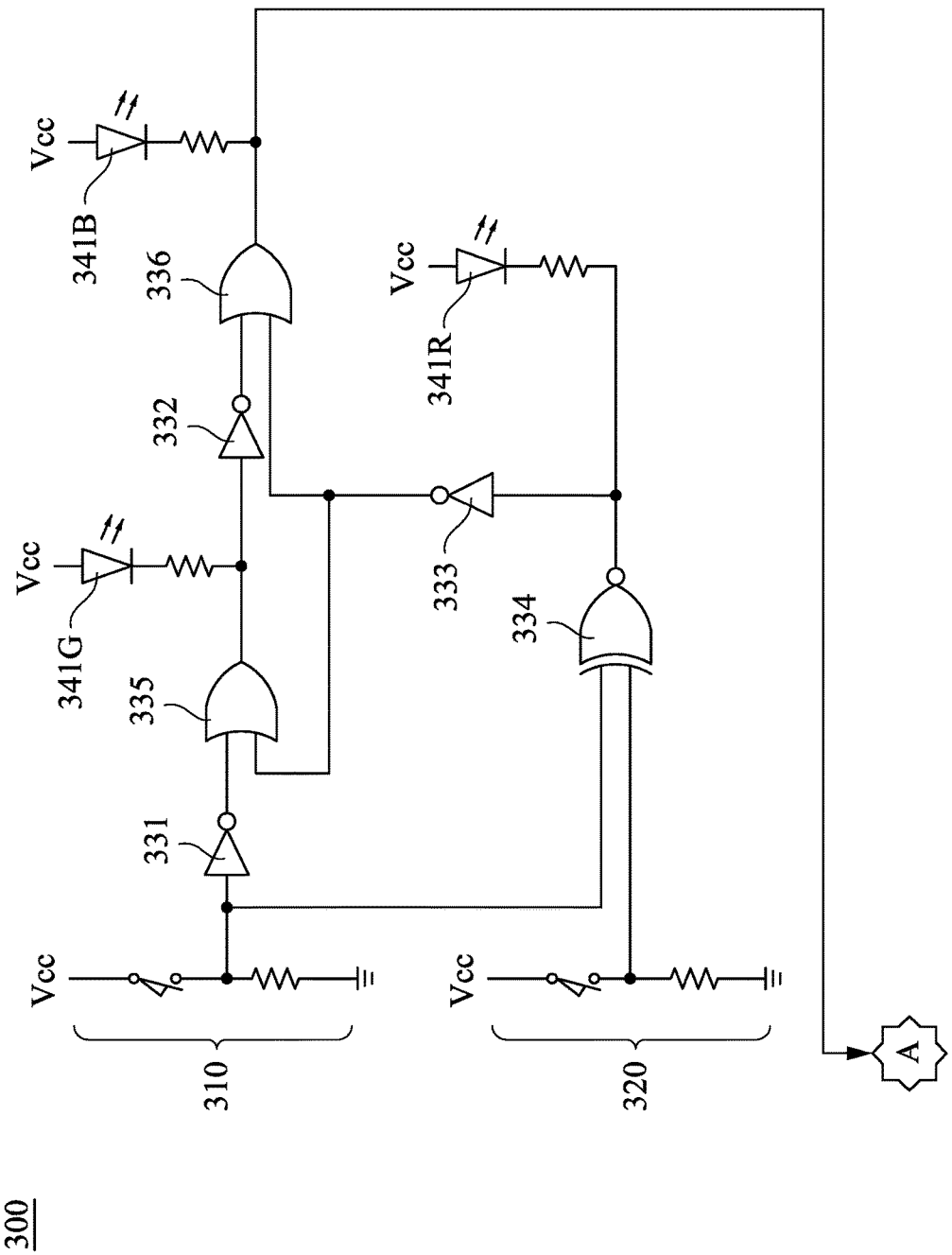
FIG. 5 is a schematic circuit diagram of one of the sensing circuit modules shown in FIG. 4.
Figure 6:
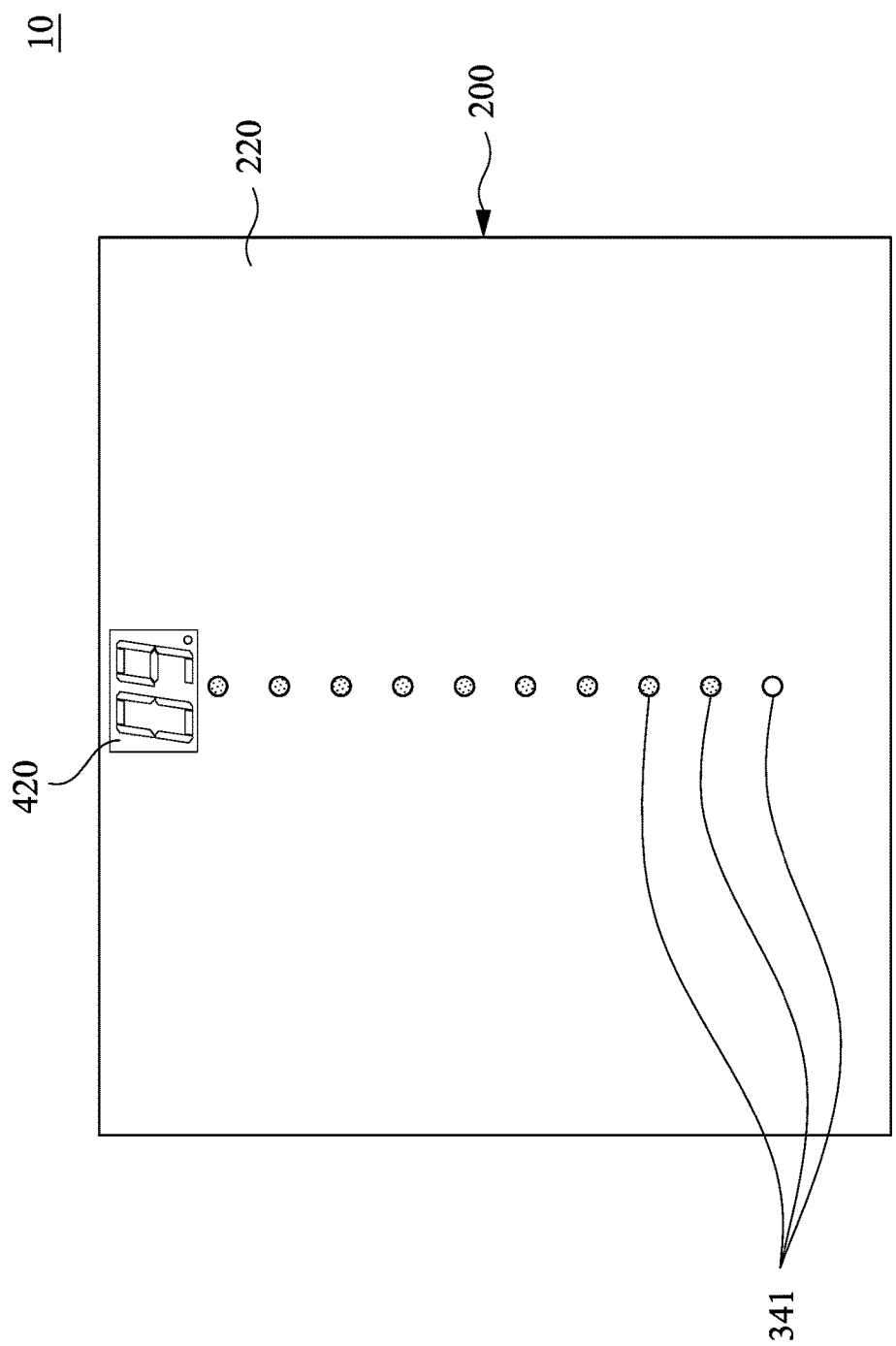
FIG. 6 is a top view of a cover body of the wafer shipping device shown in FIG. 1.

Reference is now made to FIG. 5 and FIG. 6 in which FIG. 5 is a schematic circuit diagram of one of the sensing circuit modules 300 shown in FIG. 4, and FIG. 6 is a top view of a cover body 200 of the wafer shipping device 10 shown in FIG. 1. As shown in FIG. 5 and FIG. 6, in the embodiment, each of the warning devices 340 includes a number of light emitting units having different colors, and the light emitting units are disposed on the cover body 200 and are electrically connected to the indication circuit 330. One of the indication signals issued by the indication circuit 330 can be used to activate one of the light emitting units. For example but not limited to, each of the warning devices 340 includes a green light emitting unit 341G, a red light emitting unit 341R and a blue light emitting unit 341B. The green light emitting unit 341G, the red light emitting unit 341R and the blue light emitting unit 341B are respectively electrically connected to the indication circuit 330. Specifically, the green light emitting unit 341G, the red light emitting unit 341R and the blue light emitting unit 341B of each of the warning devices 340 are collectively encapsulated in a light emitting diode module 341 together, and the light emitting diode modules 341 of the warning devices 340 are linearly arranged on the cover body 200. For example, the green light emitting unit 341G, the red light emitting unit 341R and the blue light emitting unit 341B are arranged on the outer surface 202 of the cover body 200.

It is noted that, each of the green light emitting unit 341G, the red light emitting unit 341R and the blue light emitting unit 341B can be a LED or a micro LED. However, the present disclosure is not limited thereto.

More specifically, each of the indication circuits 330 further includes a first inverter 331, a second inverter 332, a third inverter 333, a XNOR logic gate 334, a first OR logic gate 335 and a second OR logic gate 336. The first sensor 310 is electrically connected to the first inverter 331 and the XNOR logic gate 334. The first OR logic gate 335 is electrically connected to the first inverter 331, the green light emitting unit 341G and the second OR logic gate 336. The green light emitting unit 341G is electrically connected to the first OR logic gate 335 and the second inverter 332. The second inverter 332 is electrically connected to the green light emitting unit 341G and the second OR logic gate 336. The blue light emitting unit 341B is electrically connected to the second OR logic gate 336. The second sensor 320 is electrically connected to the XNOR logic gate 334. The XNOR logic gate 334 is electrically connected to the third inverter 333 and the red light emitting unit 341R. The third inverter 333 is electrically connected to the XNOR logic gate 334 and the red light emitting unit 341R. Thus, when both of the first sensor 310 and the second sensor 320 of the same pair sense the semiconductor wafer S, the corresponding indication signal issued by the indication circuit 330 activates the green light emitting unit 341G; when neither the first sensor 310 nor the second sensor 320 of the same pair senses any object, the corresponding indication signal issued by the indication circuit 330 activates the blue light emitting unit 341B; or when any of the first sensor 310 and the second sensor 320 of the same pair senses the semiconductor wafer S, the corresponding indication signal issued by the indication circuit 330 activates the red light emitting unit 341R.

Figure 7:
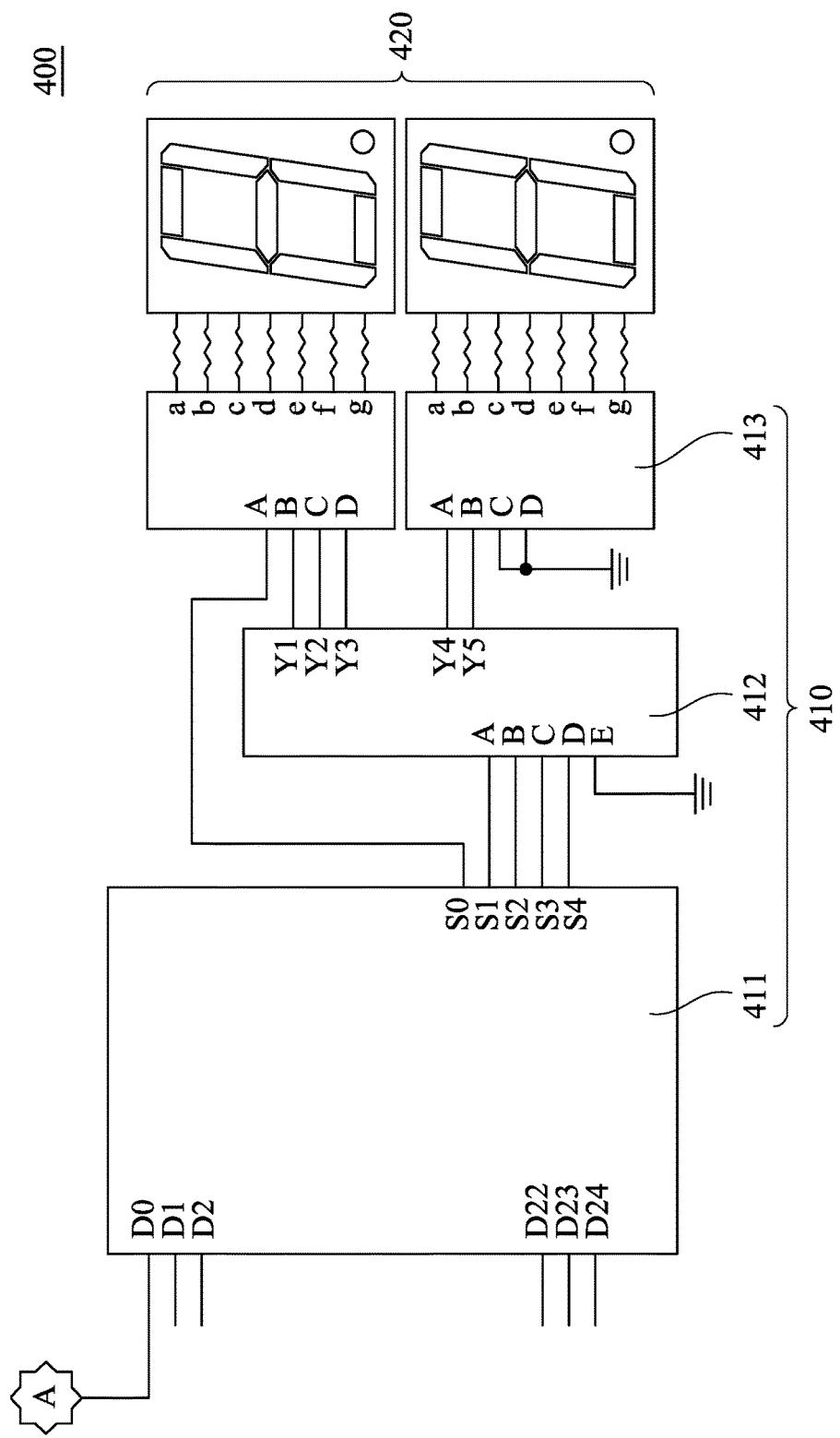
FIG. 7 is a schematic circuit diagram of a counting module of FIG. 4.

FIG. 7 is a schematic circuit diagram of a counting module 400 shown in FIG. 4. In the embodiment, as shown in FIG. 7, the wafer shipping device 10 further includes a counting module 400. The counting module 400 includes a counter 410 and a display 420. The counter 410 is electrically connected to the indication circuits 330 of the sensing circuit modules 300, and is used to count the number of the particular type of the indication signals respectively issued by some or all of the indication circuits 330. For example, the counter 410 counts the number of the semiconductor wafers S respectively received in each of the first inserting slots 105 and each of the second inserting slots which are horizontally aligned with each other, that is, the counter 410 counts the number of the activated green light emitting units 341G (FIG. 5). The display 420 is disposed on the cover body 200, and is electrically connected to the counter 410. The display 420 is used to display the number of the particular type of the indication signals. However, the present disclosure is not limited thereto. In another embodiment, the display 420 also may be disposed on the box body 100 or another position. For example, in this embodiment, as shown in FIG. 6, in ten light emitting diode modules 341, when nine of the light emitting diode modules 341 emit green light, and only one of the light emitting diode modules 341 emits red light, the display 420 shows a number 9 representing the number of the activated green light emitting units 341G.

For example, the counter 410 includes an adder array group 411, a bit-carry converter 412, and a decoder 413. The adder array group 411 is electrically connected to the bit-carry converter 412 and each indicator circuit 330 (see code A in FIG. 5 and FIG. 7). The bit-carry converter 412 is electrically connected to the adder array group 411 and the decoder 413. The bit-carry converter 412 is a binary to decimal converter. The decoder 413 is electrically connected to the bit-carry converter 412 and the display 420. However, the present disclosure is not limited to the counting pattern. The display 420 is a seven-segment display, but the present disclosure is not limited thereto.

Figure 8:
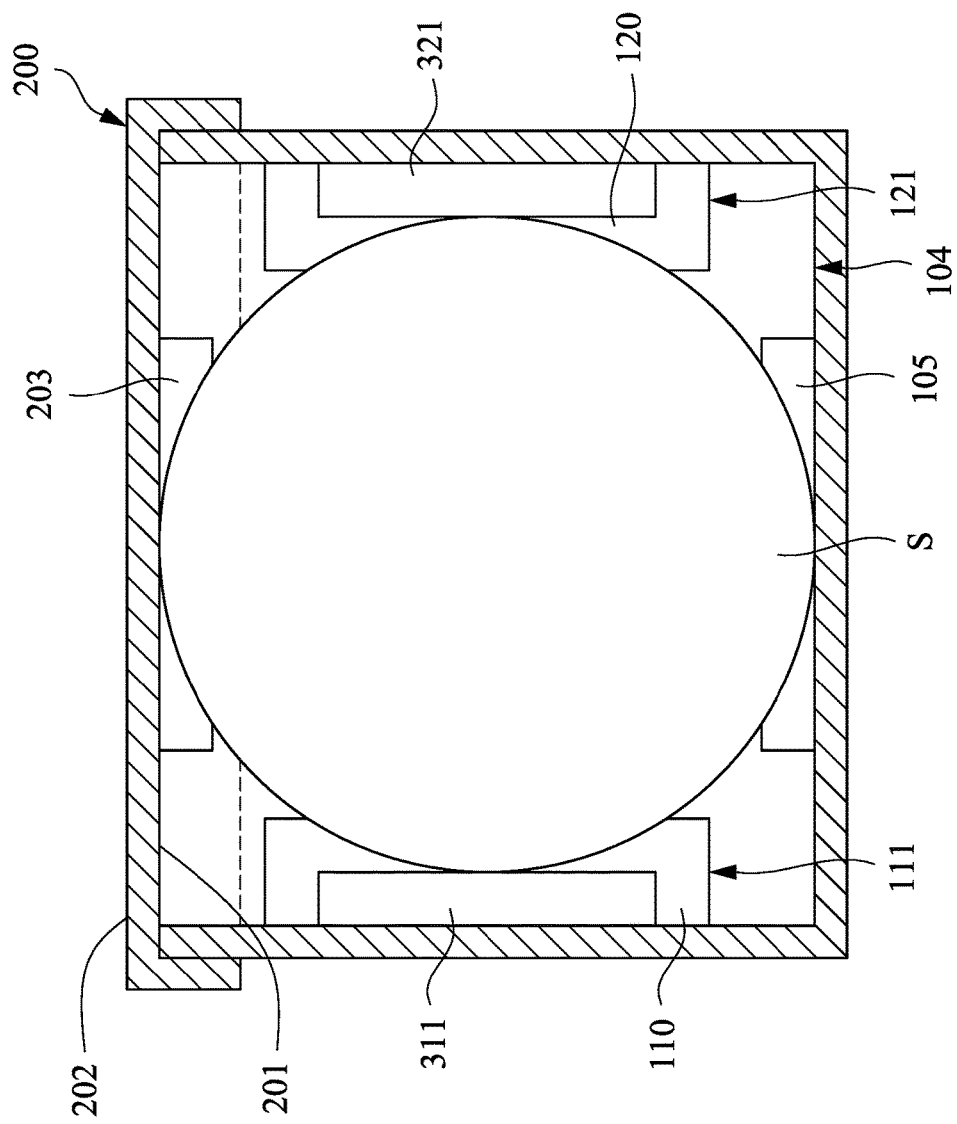
FIG. 8 is a schematic cross-sectional view of a wafer shipping device according to another embodiment of the present disclosure.

FIG. 8 is a schematic cross-sectional view of a wafer shipping device 11 according to another embodiment of the present disclosure. As shown in FIG. 1 and FIG. 8, the wafer shipping device 11 of FIG. 8 and the wafer shipping device 10 of FIG. 1 are substantially the same, in which the same elements are labeled with the same numerical references in FIG. 8. However, at least one difference between the wafer shipping device 11 of FIG. 7 and the wafer shipping device 10 of FIG. 1 is that, the first sensor 311 and the second sensor 321 are respectively disposed in the first slit 111 and the second slit 121 which are horizontally aligned with each other, rather than being disposed in the first inserting slot 105 and the second inserting slot 203. The warning device 340, the first sensor 311, the second sensor 321 and the indication circuit 330 of each of the sensing circuit modules 300 are all disposed on the box body 100.

Therefore, after these semiconductor wafers S are loaded by a user, with the reminder of the warning device 340, the user can accurately determine whether each of the semiconductor wafers S is placed in the correct position in the wafer shipping device 11 without using the cover body 200 to cover the box body 100, thereby quickly correcting the position of the misaligned semiconductor wafer S.

Figure 9:
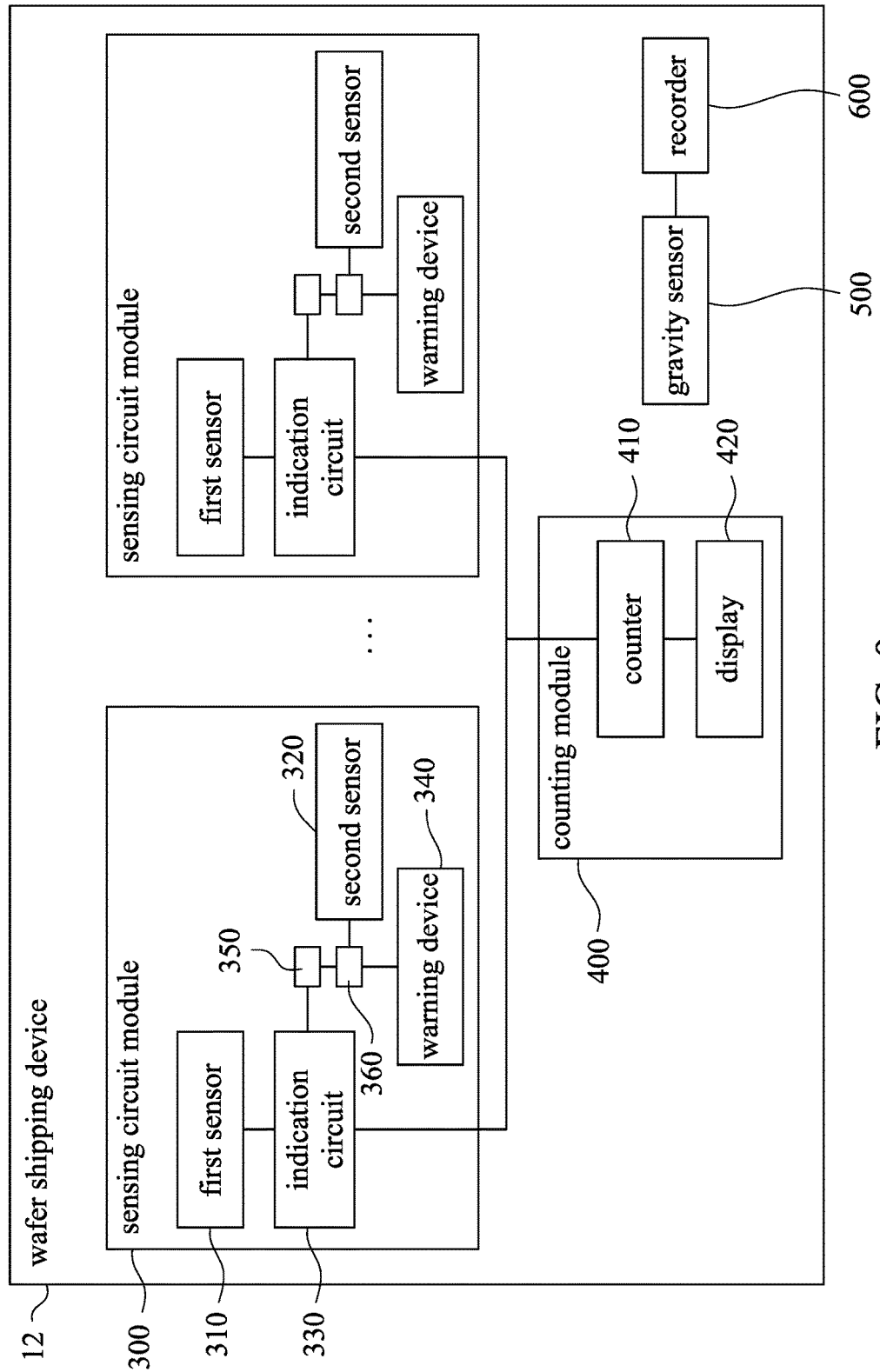
FIG. 9 is a block diagram of a wafer shipping device according to another embodiment of the present disclosure.

FIG. 9 is a block diagram of the wafer shipping device 12 according to another embodiment of the present disclosure. As shown in FIG. 4 and FIG. 9, the wafer shipping device 10 of FIG. 4 and the wafer shipping device 12 of FIG. 9 are substantially the same, in which the same elements are labeled with the same numerical references in FIG. 9. However, at least one difference between the wafer shipping device 12 of FIG. 9 and the wafer shipping device 10 of FIG. 4 is that, the wafer shipping device 12 includes a gravity sensor 500 and a recorder 600. The gravity sensor 500 is fixed on the cover body 200 or the box body 100. The gravity sensor 500 is electrically connected to the recorder 600, and is used to send a sensing signal to the recorder 600 when the wafer shipping device 12 is dropped down. Thus, with the counts recorded by the recorder 600, the user may know whether the wafer shipping device 12 has ever been dropped down during handling, and even may know the number of times that the wafer shipping device 12 has ever been dropped down.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A wafer shipping device, comprising:
    a box body having at least one first inserting slot;
    a first side rack disposed in the box body, the first side rack having at least one first slit;
    a second side rack that is disposed in the box body and is opposite to the first side rack, the second side rack having at least one second slit corresponding to the at least one first slit;
    a cover body detachably covering the box body, the cover body having at least one second inserting slot that is horizontally aligned with the at least one first inserting slot, the at least one second inserting slot facing the at least one first inserting slot correspondingly, wherein the at least one first slit, the at least one second slit, the at least one first inserting slot and the at least one second inserting slot are horizontally arranged for collaboratively holding a semiconductor wafer; and
    at least one sensing circuit module, comprising:
        a warning device;
        a first sensor disposed in the box body for independently sensing whether the semiconductor wafer is inserted in the first inserting slot;
        a second sensor disposed in the at least one second inserting slot, and horizontally aligned with the first sensor for independently sensing whether the semiconductor wafer is inserted into the at least one second inserting slot;
        an indication circuit electrically connected to the first sensor, the second sensor and the warning device, for issuing one of a plurality of types of indication signals to the warning device in response to sensing results obtained from the first sensor and the second sensor correspondingly;
        a first conductive pattern disposed on the box body and electrically connected to the indication circuit and the first sensor; and
        a second conductive pattern disposed on the cover body and electrically connected to the second sensor and the warning device,
    wherein, when the cover body covers the box body and the first conductive pattern is in physical contact with the second conductive pattern, the indication circuit of the at least one sensing circuit module is electrically connected to the second sensor and the warning device.

2. The wafer shipping device of claim 1, wherein the first sensor is disposed in the at least one first inserting slot.

3. The wafer shipping device of claim 1, wherein, when a number of each of the at least one first slit, the at least one second slit, the at least one first inserting slot, the at least one second inserting slot and at least one sensing circuit module is more than one, the first slits, the second slits, the first inserting slots, the second inserting slots are arranged in parallel in an arrangement direction; and
    the wafer shipping device further comprises:
        a counter electrically connected to the indication circuits of the sensing circuit modules for counting the number of the indication signals issued by the indication circuits; and
        a display electrically connected to the counter for displaying the number of the indication signals counted by the counter.

4. The wafer shipping device of claim 1, wherein the first sensor is disposed in the at least one first slit.

5. The wafer shipping device of claim 1, wherein the warning device comprises:
    a plurality of light emitting units having different colors, wherein the light emitting units are disposed on the cover body and are electrically connected to the indication circuit,
    wherein the one of the types of indication signals correspondingly issued by the indication circuit activates one of the plurality of light emitting units.

6. The wafer shipping device of claim 1, wherein the warning device comprises a green light emitting unit, a red light emitting unit, and a blue light emitting unit, and the green light emitting unit, the red light emitting unit, and the blue light emitting unit are respectively electrically connected to the indication circuit,
    wherein, when both of the first sensor and the second sensor sense the semiconductor wafer, the one of the types of indication signals correspondingly issued by the indication circuit activates the green light emitting unit,
    when neither the first sensor nor the second sensor senses any object, the one of the types of indication signals correspondingly issued by the indication circuit activates the blue light emitting unit, or
    when one of the first sensor and the second sensor senses the semiconductor wafer, the one of the types of indication signals correspondingly issued by the indication circuit activates the red light emitting unit.

7. The wafer shipping device of claim 6, wherein the green light emitting unit, the red light emitting unit and the blue light emitting unit are collectively encapsulated in a light emitting diode module, and the light emitting diode module is arranged on the cover body.

8. The wafer shipping device of claim 1, wherein at least one of the first sensor and the second sensor is a pressure sensor, an optical transceiver sensor, a magnetoresistance sensor or a physical button switch.

9. The wafer shipping device of claim 1, further comprising:
- a recorder; and
- a gravity sensor that is fixed on the cover body or the box body and is electrically connected to the recorder for sending a sensing signal to the recorder when the wafer shipping device is dropped down.

* * * * *